United States Patent
Di Giacomo et al.

(10) Patent No.: US 6,214,647 B1
(45) Date of Patent: Apr. 10, 2001

(54) METHOD FOR BONDING HEATSINK TO MULTIPLE-HEIGHT CHIP

(75) Inventors: Giulio Di Giacomo, Hopewell Junction; Stephen S. Drofitz, Jr., Wappingers Falls; David L. Edwards, Poughkeepsie; Sushumna Iruvanti, Wappingers Falls; David J. Womac, Lagrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/159,239

(22) Filed: Sep. 23, 1998

(51) Int. Cl.[7] ................ H01L 21/44; H01L 21/48; H01L 21/50
(52) U.S. Cl. .................. 438/122; 257/718; 257/713
(58) Field of Search ................ 257/713, 718; 438/122

(56) References Cited

U.S. PATENT DOCUMENTS

| | | |
|---|---|---|
| 3,993,123 | 11/1976 | Chu et al. . |
| 4,034,468 | 7/1977 | Koopman . |
| 4,034,469 | 7/1977 | Koopman et al. . |
| 4,193,445 * | 3/1980 | Chu et al. ................ 165/79 |
| 4,203,129 | 5/1980 | Oktay et al. . |
| 4,462,462 * | 7/1984 | Meagher et al. ............ 165/80.1 |
| 4,607,277 * | 8/1986 | Hassan et al. ............ 257/713 |
| 4,783,721 | 11/1988 | Yamamoto et al. . |
| 5,097,385 | 3/1992 | Chao-Fan Chu et al. . |
| 5,623,394 * | 4/1997 | Sherif et al. ............ 361/705 |
| 5,981,310 * | 11/1999 | DiGiacomo et al. .......... 438/106 |

OTHER PUBLICATIONS

"High Performance Air–Cooled Module", IBM Technical Disclosure Bulletin, vol. 28, No. 7, pp. 3058–3059, Dec. 1985.*

* cited by examiner

*Primary Examiner*—Olik Chaudhuri
*Assistant Examiner*—Howard Weiss
(74) *Attorney, Agent, or Firm*—McGinn & Gibb, PLLC; H. Daniel Schurmann, Esq.

(57) ABSTRACT

A method and structure for thermally connecting a thermal conductor to at least one chip, the thermal conductor including a lower surface and at least one piston extending from the lower surface corresponding to each of the chips, each of the chips having an upper surface opposing each of the pistons, the chips being mounted on a substrate, the method comprising steps of metalizing the lower surface of the thermal conductor and the pistons, applying a solder to the lower surface of the thermal conductor, applying a thermal paste between the upper surface of the chips and the pistons, positioning the substrate and the thermal conductor such that the substrate is aligned with the thermal conductor, biasing the thermal conductor toward the substrate, biasing the pistons toward the chips such that the thermal paste has a consistent thickness between each of the chips and the pistons, reflowing the solder, such that the solder bonds the substrate to the thermal conductor and the pistons form a metallurgical bond with the thermal conductor, wherein after the reflowing step, the pistons and the thermal conductor form a unitary structure for maintaining the consistent thickness of the thermal paste between each of the chips and the pistons which achieves a considerably thinner thermal paste layer and greater thermal conduction.

20 Claims, 2 Drawing Sheets

METHOD FOR BONDING HEATSINK TO MULTIPLE-HEIGHT CHIP

DESCRIPTION BACKGROUND OF THE INVENTION

1. Field of the Invention

The present invention generally relates to devices and methods for thermally connecting heatsinks and other heat conductive caps to semiconductor chips.

2. Description of the Related Art

Conventional systems utilize adhesives and thermally conductive pastes to connect cap/integral heatsinks to semiconductor substrate/chip structures. For example, in conventional structures, a layer of thermal paste is placed between the chip and the cap/integral heatsink and the cap/integral heatsink is then joined to the substrate.

However, the height of the chip above the substrate could vary from chip to chip. This is especially true with multichip packages. In the case of a paste interface, when cap/integral heatsink dimensional tolerances are included, the thickness of the thermal paste between the top of the chip and the bottom of the cap/integral heatsink could also vary by as much as +/−3 mils.

Since the thickness of the thermal paste in conventional structures could vary by +/−3 mils (and generally exceeds 6 mils in nominal thickness) the heat transfer characteristics of conventional structures vary widely and are less efficient than if the thermal paste gap could be formed more repeatedly and thinner. A discussion of some conventional structures follows.

Some conventional structures utilize a complex cooling hat. Over each of the flip chips on the substrate is a hole in the hat. From each hole extends a spring loaded piston that contacts the back of the chip. These modules are hermetic, and are filled with helium. The primary cooling path is from the circuit side of the chip, through the thickness of the chip, to the face of the piston, up the piston, to the inside of the hat, to the back of the hat, across an interface, to an attached cold plate and to water circulating through the cold plate. The high helium content of the gas in the module greatly reduces the thermal resistances of the chip-to-piston interface and the piston-to-hat interface.

Conventional structures also include a matrix of pistons that contact the back of the chip for cooling. To maintain almost full coverage of the back of the chip, headers are used on the faces of each of the pistons.

Conventional structures also use barrel shaped pistons to allow tighter piston to hat gaps, while maintaining the ability to accommodate chip tilt. Material changes also improve thermal performance. For example, conventionally pistons are made of copper rather than aluminum, and the module can be filled with oil rather than helium.

Further, conventionally solder is included with each of the pistons so that the solder can be reflowed after assembly, to fill the chip-to-piston and piston-to-hat gaps, for improved thermal performance.

In conventional flat plate cooling (FPC), a flat plate just above the array of chips is water cooled. Thermal paste is used to fill the gaps between the chips and the flat plate.

Stable high solids, high thermal conductivity paste is also conventionally available. High thermal conductivity is accomplished by high solids loading, which is accomplished by using a range of particle sizes, and coating the particles with a dispersant. This allows a significant improvement in the thermal conductivity of thermal pastes.

Other conventional structures use spreader plates between the chips and the hat. The spreader plates are soldered to the backs of the chips and then thermally connected to the inside of the hat by a layer of thermal paste.

Conventional structures also include a thermal path that leads first to a cooling plate which has holes that house pistons that will be locked into position. The pistons are joined to the side-walls of the holes by solder, and the piston faces contact the backs of the chips. Conventionally, thermal paste is used to fill the chip-to-piston interface. The assembly conventionally requires two steps, a set up step to reflow the solder and lock the pistons into their final positions (customized to that module) and a separate assembly step where the hat is attached to the substrate, enclosing the chips. The mating surfaces of the hat and piston are metalized for solderability.

The conventional structures use water circulating systems applicable to high-end thermal conduction modules (TCM's), which feature an interface with the external plate which curtails thermal conduction and which is restricted to limited choices of materials, while the design is not readily extendible to air cooled multichip modules (MCM) and low-end MLC modules.

SUMMARY OF THE INVENTION

It is, therefore, a purpose of the present invention to provide a structure and method for attaching cap/integral heatsinks to semiconductor chips and more specifically to forming a consistently thin layer of a thermal paste between the cap/integral heatsink and the chips.

More specifically, the invention includes a method for thermally connecting a cap/integral heatsink to at least one chip, the cap/integral heatsink including a lower surface and at least one piston extending from the lower surface corresponding to each chip, each chip having an upper surface opposing each piston, the chips being mounted on a substrate, the method comprising steps of metalizing the lower surface of the cap/integral heatsink and the pistons, applying a solder to the lower surface of the cap/integral heatsink, applying a thermal paste between the upper surface of the chips and the pistons, positioning the substrate and the cap/integral heatsink such that the substrate is aligned with the cap/integral heatsink, biasing the cap/integral heatsink toward the substrate, biasing the pistons toward the chips, such that the thermal paste has a consistent thickness between each of the chip and the pistons, reflowing the solder, such that the solder bonds the substrate to the cap/integral heatsink and bonds the pistons to the cap/integral heatsink, wherein after the reflowing step, the pistons and the cap/integral heatsink form a unitary structure which maintains the thermal paste gap between chips and the pistons.

The metalizing step comprises metalizing the lower surface of the cap/integral heatsink and the pistons with solder wettable metallurgy. The step of applying the solder to the lower surface of the cap/integral heatsink comprises a step of applying solder preforms to areas of the lower surface of the cap/integral heatsink adjacent the pistons. The step of biasing the pistons toward the chips comprises a step of inserting springs between the cap/integral heatsink and the pistons and applying/dispensing thermal paste to chips. The step of biasing the pistons toward the at least one chip comprises a step of supplying sufficient force between the pistons and the chips to achieve a thermal paste gap of 3 mils. During the reflowing step, the solder fills all gaps between the pistons and the cap/integral heatsink. Each of the at least one chip may have a different height above the substrate when compared to others of the at least one chip and the step of biasing the at least one piston toward the at least one chip accommodates for the different height.

The invention also includes a method for attaching a cap/integral heatsink to a multi-chip structure, the cap/integral heatsink including a plurality of movable pistons opposing each of a plurality of chips of the multi-chip structure, the method comprising steps of applying a thermal paste between each of the chips and the pistons, adjusting a position of the pistons to form a consistent layer of thermal paste between the each of chips and the pistons, forming a metallurgical bond between the pistons and the cap/integral heatsink such that the pistons are permanently fixed in a position to maintain the consistent layer of thermal paste, bonding the cap/integral heatsink to the multi-chip structure.

The step of forming a metallurgical bond comprises steps of metalizing a lower surface of the cap/integral heatsink and the pistons, applying a solder to the lower surface of the cap/integral heatsink, assembling the heat sink and the multi-chip structure and reflowing the solder such that the solder forms the metallurgical bond. The metalizing step comprises metalizing the lower surface of the cap/integral heatsink and the pistons. The step of applying the solder comprises a step of applying solder preforms. The step of applying the thermal paste comprises applying the thermal paste to the backs of the chips by screening or use of an automated dispense tool. The step of adjusting a position of the pistons comprises a step of inserting springs between the cap/integral heatsink and the pistons. The step of adjusting a position of the pistons comprises a step of supplying sufficient force between the pistons and the chips to consistently narrow the layer of the thermal paste to about 3 mils. The chips may have different heights and the step of adjusting the position of the pistons accommodates for the different heights.

The invention also includes a method for attaching a cap/integral heatsink to a multi-chip structure having a substrate and a plurality of chips mounted on the substrate, the cap/integral heatsink including a lower surface and a plurality of pistons extending from the lower surface corresponding to each of the chips, each of the chips having an upper surface opposing a corresponding one of the pistons, the method comprising steps of metalizing the lower surface of the cap/integral heatsink and the at least one pistons with solder wettable metallurgy, applying a plurality of solder preforms to the lower surface of the cap/integral heatsink adjacent each of the pistons, applying a thermal paste comprising a conductive solid particle dispersion/suspension between the upper surface of each of the chips and the pistons, positioning the substrate and the cap/integral heatsink such that the substrate is aligned with the cap/integral heatsink, biasing the cap/integral heatsink toward the substrate with a clamp, biasing the pistons toward the chips with springs, such that the thermal paste has a consistent thickness between each of the chips and pistons, reflowing the solder preforms, such that the solder bonds the substrate to the cap/integral heatsink and reacts with the solder wettable metallurgy, to form a metallurgical bond between the pistons and the cap/integral heatsink and fills all gaps between the pistons and the cap/integral heatsink, wherein after the reflowing step, the pistons and the cap/integral heatsink form a unitary structure which maintains the consistent thickness of the thermal paste between each of the chips and the pistons.

The invention also includes a multi-chip structure comprising a substrate, a plurality of chips mounted on the substrate, a cap/integral heatsink mounted on the substrate and covering the chips, the cap/integral heatsink including a plurality of fixed pistons, each of the pistons extending from the cap/integral heatsink toward a corresponding chip of the chips, and a thermal paste positioned between the pistons and the chips, wherein each of the pistons extends from the cap/integral heatsink a unique distance such that a distance between each piston and the corresponding chip comprises a consistent distance and the thermal paste has a consistent thickness between all the pistons and the chips.

The thermal paste comprises a conductive solid particle dispersion. The cap/integral heatsink is bonded to the substrate with one of a seal material comprising solder and a polymer. The pistons are metallurgically bonded to the cap/integral heatsink through solder reaction with the metalization layers. The chips may have different heights above the substrate, and the pistons extending from the cap/integral heatsink have a unique distance which accommodates for the different chip heights.

The invention also includes a multi-chip structure including a substrate having a plurality of chips and a cap/integral heatsink, the cap/integral heatsink including a lower surface and a plurality of pistons extending from the lower surface corresponding to each of the chips, each of the chips having an upper surface opposing a corresponding one of the pistons, the multi-chip structure being formed by a process comprising steps of metalizing the lower surface of the cap/integral heatsink and the pistons, applying a solder to the lower surface of the cap/integral heatsink, applying a thermal paste between the upper surface of the chips and the corresponding one of the pistons, positioning the substrate and the cap/integral heatsink such that the substrate is aligned with the cap/integral heatsink, biasing the cap/integral heatsink toward the substrate, biasing the pistons toward the chips, such that the thermal paste has a consistent thickness between each of the chips and the pistons, reflowing the solder, such that the solder bonds the substrate to the cap/integral heatsink and the pistons form a metallurgical bond with the cap/integral heatsink, wherein after the reflowing step, the pistons and the cap/integral heatsink form a unitary structure which maintains the consistent thickness of the thermal paste between the each of the chips and the corresponding one of the pistons.

The step of applying the thermal paste comprises applying the thermal paste to the backs of the chips by screening or use of an automated dispense tool. The metalizing step comprises metalizing the lower surface of the cap/integral heatsink and the pistons. The step of applying the solder to the lower surface of the cap/integral heatsink comprises a step of applying solder preforms to areas of the lower surface of the cap/integral heatsink adjacent the pistons. The step of biasing the cap/integral heatsink toward the substrate comprises a step of temporarily clamping the cap/integral heatsink to the substrate. The step of biasing the pistons toward the chips comprises a step of inserting springs between the cap/integral heatsink and the pistons. The step of biasing the pistons toward the chips comprises a step of supplying sufficient force between the pistons and the chips to narrow the consistent thickness of the thermal paste to about 3 mils. During the reflowing step, the solder fills all gaps between the pistons and the cap/integral heatsink. Each of the chips may have a different height above the substrate when compared to others of the chips and the step of biasing the pistons toward the chips accommodates for the different heights.

With the invention, the thermal paste is maintained at a thickness of about 3 mils between the top of the semiconductor chip and the bottom of the cap/integral heatsink, regardless of variation in chip of height. Therefore, with the invention, superior and consistent thermal transfer characteristics are produced when compared to conventional structures which have a thicker and more variable layer of thermal paste.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
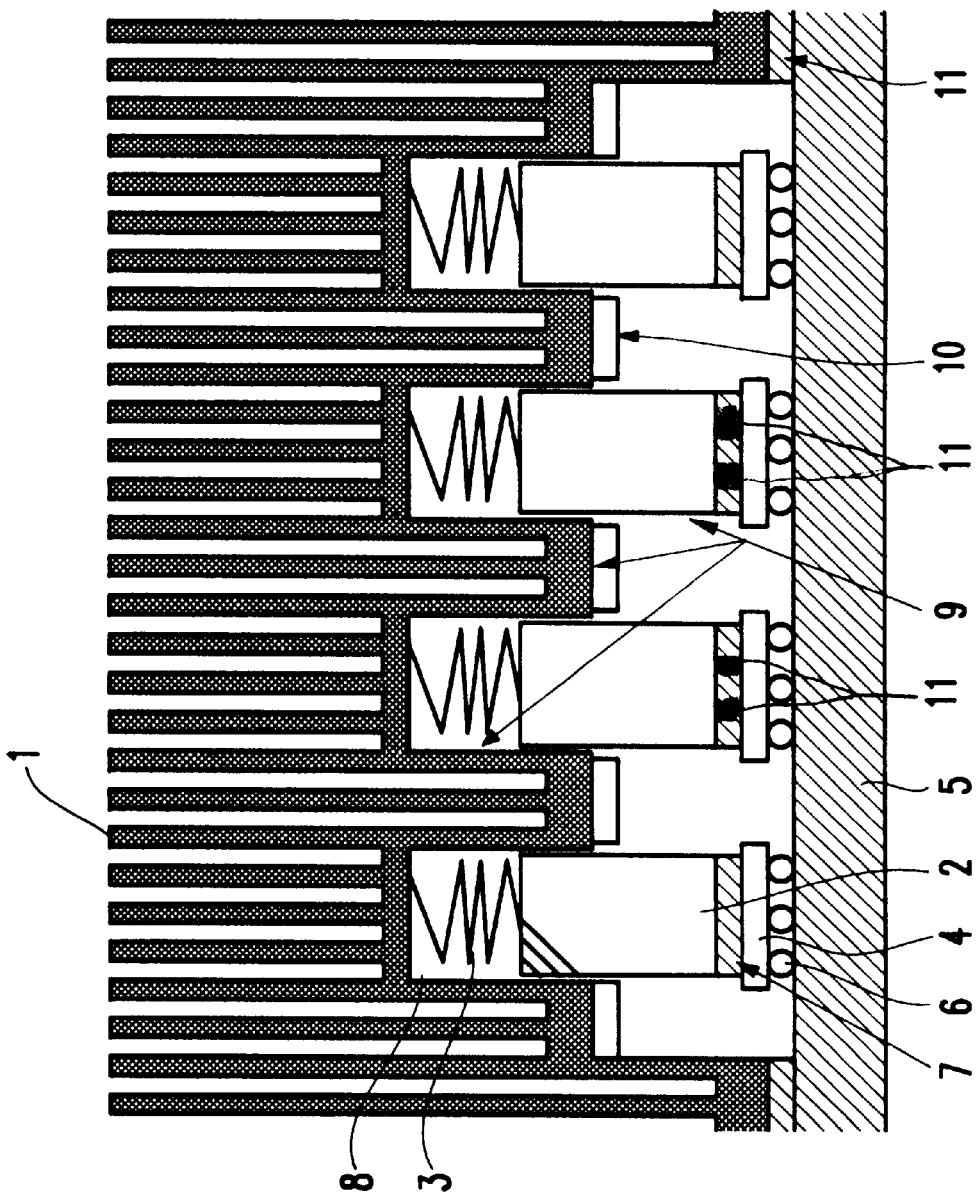
FIG. 1 is a schematic diagram of a chip/substrate structure and heat sink structure.

Referring now to the drawings, and more particularly to FIG. 1, a cap/integral heatsink 1 is illustrated. The cap/integral heatsink 1 includes cylinders, blind holes or piston holes 8 which hold pistons 2 which are biased toward the chips 4 via springs 3. One or more semiconductor chips 4 are thermally connected to the cap/integral heatsink 1. The chips 4 are mounted on a substrate 5 with solder balls 6 or other conventional attachment structures. A thermal paste 7 or other compliant thermal conductor material connects the pistons 2 to the top of the chips 4.

While the structure illustrated in FIG. 1 is a cap or an integral heatsink with cooling fins (referred to herein as "cap/integral heatsink"), as would be known by one ordinarily skilled in the art given this disclosure, the invention is equally applicable to any thermal conductor which is mounted over chips (which vary in height) where a consistent thickness of thermal paste between the top of the chips and the thermal conductor is important. The invention is not limited to the embodiment of the invention shown in FIG. 1 (e.g., a cap/integral heatsink), but instead is applicable to any similar heat dissipating structure (e.g., air cooled, liquid cooled, etc.) which is thermally connected to heat generating chips.

The structure shown in FIG. 1 is a multi-chip package (such as a 4×4 chip arrangement). However, the invention is suitable for any type of chip package which requires heat dissipation including single chip structures. Additionally, the invention is applicable to any type of structure which covers a variety of elements with a single cap/integral heatsink.

The composition of the individual elements shown in FIG. 1 is well known to those ordinarily skilled in the art and could be formed from a wide selection of materials and substances. For example, the cap/integral heatsink 1 could be formed of many materials such as aluminum, aluminum nitride, silicon carbide, aluminum silicon carbide, tungsten copper, etc. The pistons 2 could be formed of aluminum, aluminum nitride, silicon carbide, aluminum silicon carbide, tungsten copper or other similar conductive materials that match the thermal coefficient of expansion of the cap/integral heatsink. Similarly, the substrate 5 could be formed from many materials such as alumina, silica, glass, glass ceramic, ceramic, mullite, aluminum nitride or other well known materials. The semiconductor chips 4 could be attached to the substrate 5 with a number of well known bonding agents such as solder. Also, the thermal paste 7 could be a conductive solid particle dispersion or any similarly suitable compliant thermally conductive material.

Such a chip/substrate structure commonly exhibits large variations in the chip heights. More specifically, a difference in chip heights on different modules could vary by several mils. This variation in chip heights presents a thermal variation in conventional structures which attach a flat (e.g., machined) cap/integral heatsink across multiple chips 4 because the difference in chip height will cause different thicknesses of thermal paste 7 to form in the gaps between the top of the chips 4 and the bottom of the cap/integral heatsink, 1.

The invention overcomes the problems of conventional structures by utilizing a unique method and structure to thermally connect the cap/integral heatsink 1 to the chip 4. More specifically, the bottom of the cap/integral heatsink 1 (including the cylinders 8 and pistons 2) is metalized with at least one layer of solder wettable material by common deposition methods, such as sputtering, deposition and evaporation to form a solder wettable metalization layer 9. The side walls of the pistons are also metalized.

A seal 11 is formed between the substrate 5 and the cap/integral heatsink 1 to attach the cap/integral heatsink 1 firmly to the substrate 5. Such seal could also comprise any suitable solder or polymer.

The substrate 5 is aligned with and biased against the cap/integral heatsink 1 either by clamp or gravity pressure (e.g., additional weight). The solders are heated to a sufficient temperature to cause the solders 10, 11 to melt (e.g., to reflow) and the springs bias the pistons 2 toward the chips 4. If the structure is sealed with a polymer rather than solder, sufficient time at elevated temperature is needed to cure the adhesive.

The spring constants are selected such that sufficient pressure is generated against the thermal paste 7 so as to squeeze the thermal paste 7 to a consistent thickness of about 5 mils, 3 mils or less between the pistons and the top of the chip 4 before or during the reflow process.

The solder 10 flows between the pistons 2 and cylinder 8 and reacts with the metalization layer 9. The solder 10 flows around the pistons 2 by wetting, capillary and gravitational actions. Thus, when the structure cools below the melting point of the solder 10 (e.g., after the reflow process), there are no gaps between the pistons 2 and the surface of the cap/integral heatsink 1. Additionally, after the reflow process, the cap/integral heatsink 1 is firmly attached to the substrate 5 by cured adhesive or solder joints 11.

Further, after the solder 10 has reacted with the metalization layer 9, the pistons 2 become metallurgically connected to the cylinder 8 of the cap/integral heatsink 1. After the reflow process, the pistons 2 are firmly held in place and cannot move within the cylinders or blind holes 8.

In order to facilitate there being no gaps in the solder 10 within the cylinders 8 of the cap/integral heatsink 1 (e.g., around the pistons 2), a vent hole (not shown) may be made in the pistons 2 and/or top of the cap/integral heatsink 1 to allow any gasses within the cylinder 8 to escape during the reflow and cooling process. Therefore, after the reflow process, the cap/integral heatsink 1 and pistons 2 form a unitary structure which has a higher thermal performance than a structure with movable pistons. Further, as a result of the reflow process and the action of the springs 3, the unitary cap/integral heatsink 1 structure is customized for the different chip heights of the chip matrix.

By using the springs 3 to maintain constant and controlled pressure between the pistons 2 of the cap/integral heatsink 1 and the chip 4 during the reflow process, the thickness of the thermal material between the cap/integral heatsink 1 and the chip 4 is strictly controlled. More specifically, with the above structure and method, the thickness of the thermal material can be consistently formed to any desired thickness (e.g., about 3 mils) for each chip 4 regardless of variation of the height of chips 4 on a single substrate 5.

The metallurgical connection between the pistons 2 and the cap/integral heatsink 1 provides an extremely low thermal resistance. Additionally, the 3 mil thickness of the thermal paste 7 reduces the thermal resistance when compared to conventional structures which have thicker layers of thermal paste. Indeed, the internal thermal resistance of the inventive structure is reduced by a factor of two when compared to conventional structures.

Additionally, the inventive structure is superior to structures which utilize springs to maintain pressure between movable pistons and the top of the chips 4 because such free moving pistons do not have a metallurgical bond to the cap/integral heatsink and such a conventional cap/integral heatsink does not have a unitary structure. Thus, the thermal conductivity of such a conventional structure is dramatically less than the unitary structure of the present invention.

Figure 2:
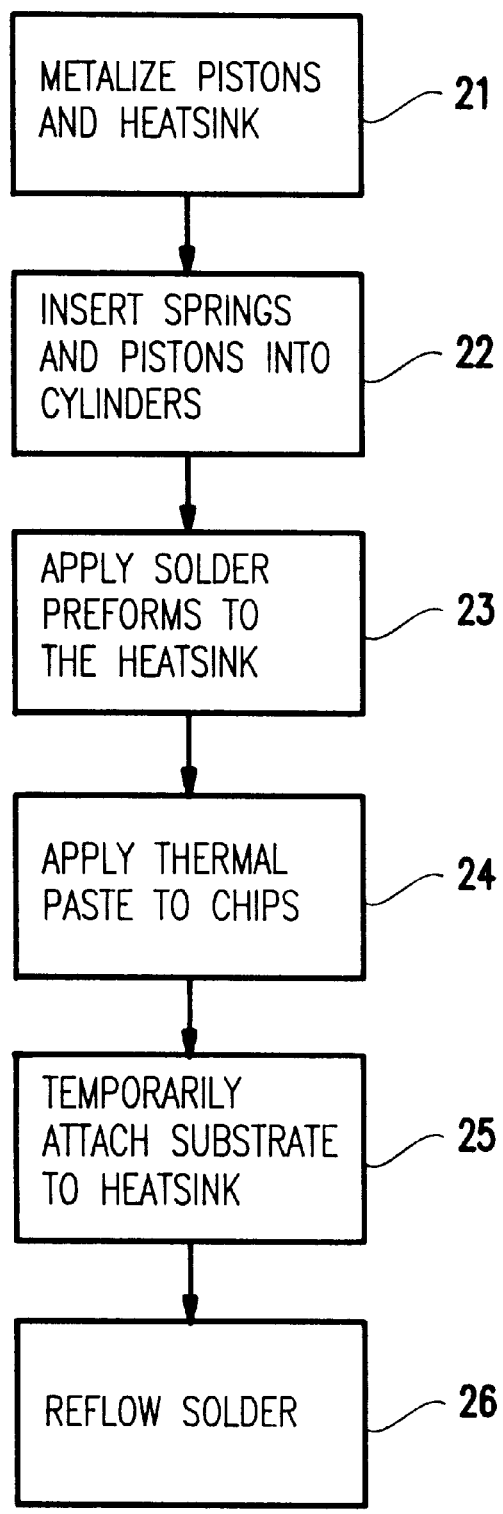
FIG. 2 is a flow diagram illustrating a preferred method of the invention.

Referring now to FIG. 2, a preferred method of the invention is illustrated. More specifically, in block 21, the pistons 4 and the bottom of the cap/integral heatsink 1 are metalized. In block 22, springs and pistons are inserted into the cylinders while the structure is inverted. In block 23, the solder preforms 10 are applied to the cap/integral heatsink 1. In block 24, a thermal paste is applied to the chip 4. In block 25, the cap/integral heatsink 1 is temporarily attached to the substrate 5 (i.e., by clamping) and the pistons 2 are biased (e.g., by the springs 3) to form a consistently thin layer of thermal paste 7 between the pistons 2 and the chip 4. In block 26 the solder is reflowed to metallurgically bond the pistons 2 to the cap/integral heatsink 1 and to completely fill the gap between the pistons and the cap/integral heatsink.

The cap/integral heatsink is also bonded to the substrate in the same reflow operation. By accommodating the different heights of various chips 4 connected to a substrate 5, through the use of moveable pistons 2 and springs, and firmly forming a unitary structure permanently connected to the substrate 5, the inventive method and structure takes advantage of the increased thermal characteristics of a unitary structure as well as the benefits which are received through the use of one-time adjustable pistons 2.

With the invention, the thermal conductive capacity is increased without expensive refrigeration or the use of exotic liquid cooling materials. Further, the metallurgical connection between the pistons and the cap/integral heatsink 1 insures that the thermal capacity of the inventive structure will have a useful lifetime.

The inventive method and structure is effective for single chip applications, multiple chip applications and multi-chip packages, such as a 4×4 chip arrangement.

The present invention is generally applicable to the entire gamut of modules from large multi-chip modules (MCM's) to the small single-chip modules (SCM's). The invention includes a unitary cap or integral heat-sink that reduces the internal thermal resistance considerably by virtue of a reduced thickness thermal paste filled chip-to-piston interface. The thickness of this paste filled gap is achieved and tightly controlled by use of precision standoffs 12 in the gap. Standoffs are small (3 mils thick) pads 12 and prevent the piston from contacting the chip surface and, therefore, further control the thickness of the thermal paste filled gap. The standoffs may be attached to the pistons, placed on the chip, or preloaded into the thermal paste. The spring against each piston has sufficient force to squeeze the thermal paste out to the thickness of the standoffs 12 (e.g, 3 mils), before or during the reflow step.

The invention utilizes a novel process of soldering the pistons to the walls of the holes in the cap/integral heat sink using preforms and capillary action during solder reflow. The pistons are thermally connected to the chips by thermal paste. Pumping of the paste due to power cycling, and stack up tolerances, limit the practical minimum thickness of the thermal paste in conventional designs. Since this novel approach overcomes stack-up tolerance drawbacks, thinner gaps may be achieved, improving thermal performance. Nominal gaps may be reduced from 6 mils to 3 mils, reducing internal thermal resistance by a factor of two.

One aspect of the current invention is to reduce and control the thickness of the thermal paste filled gap, to improve thermal performance. Another aspect of the current invention is that the sealing of the cap/integral heat sink to the substrate, the soldering of the pistons, and coupling of the pistons with the chip is done simultaneously.

The invention is applicable to narrower gaps (e.g., 2 mils, 1.5 mils) also. The chip-to-piston gap thickness is very thin and tightly controlled.

Conventional structures which dissipate heat in high-end water-cooled modules are rather expensive (or inadequate) when used with air cooled modules. The current invention opens a new way to obtain efficient cooling across various technologies in a unique way, in terms of unitary cap/integral heat sink, novel controlled paste process and novel solder preform applications. The invention has the versatility to use materials having an optimal match of thermomechanical properties, resulting in more efficient thermal enhancement system.

Therefore, with the invention the thermal characteristics of the cap/integral heatsink are improved over the conventional structures.

The invention allows higher power chips to be cooled. The invention enhances the performance of cap/integral heatsinks because it allows narrower thermal paste filled gaps between chips and cap/integral heatsinks. The narrower gaps that are achieved are reliable because of the large reduction in gap tolerance.

While the invention has been described in terms of preferred embodiments, those skilled in the art will recognize that the invention can be practiced with modification within the spirit and scope of the appended claims.

What is claimed is:

1. A method for thermally connecting a thermal conductor to at least one chip, said thermal conductor including a lower surface and at least one piston extending from said lower surface, each of said at least one chip having an upper surface opposing each of said at least one piston, said at least one chip being mounted on a substrate, said method comprising steps of:

metalizing said lower surface of said thermal conductor and said at least one piston;

applying a solder to said lower surface of said thermal conductor;

applying a thermal paste to said upper surface of said at least one chip;

positioning said substrate and said thermal conductor such that said substrate is aligned with said thermal conductor;

biasing said thermal conductor toward said substrate;

biasing said at least one piston toward said at least one chip, such that said thermal paste has a consistent thickness between each of said at least one chip and said at least one piston;

and reflowing said solder, such that said solder bonds said substrate to said thermal conductor and said at least one piston forms a metallurgical bond with said thermal conductor, wherein after said reflowing step, said at least one piston and said thermal conductor form a unitary structure for maintaining said consistent thickness of said thermal paste between each of said at least one chip and said at least one piston.

2. The method as in claim 1, wherein said metalizing step comprises a step of metalizing said lower surface of said thermal conductor and said at least one piston with a solder wettable metalization.

3. The method as in claim 1, wherein said step of applying said solder comprises a step of applying solder preforms to areas of said lower surface of said thermal conductor adjacent said at least one piston.

4. The method as in claim 1, wherein said step of biasing said thermal conductor toward said substrate comprises a step of temporarily clamping said thermal conductor to said substrate.

5. The method as in claim 1, wherein said step of biasing said at least one piston toward said at least one chip comprises a step of inserting at least one spring between said thermal conductor and said at least one piston.

6. The method as in claim 1, wherein said step of biasing said at least one piston toward said at least one chip comprises a step of supplying sufficient force between said at least one piston and said at least one chip to narrow said consistent thickness of said thermal paste to less than 5 mils.

7. The method as in claim 1, wherein said step of biasing said at least one piston toward said at least one chip comprises a step of supplying sufficient force between said at least one piston and said at least one chip to narrow said consistent thickness of said thermal paste to about 3 mils.

8. The method as in claim 1, wherein said step of biasing said at least one piston toward said at least one chip comprises a step of supplying sufficient force between said at least one piston and said at least one chip to narrow said consistent thickness of said thermal paste to less than 3 mils.

9. The method as in claim 1, wherein during said reflowing step, said solder fills all gaps between said at least one piston and said thermal conductor.

10. The method as in claim 1, wherein each of said at least one chip has a different height above said substrate and said step of biasing said at least one piston toward said at least one chip accommodates for said different height.

11. A method for thermally connecting a thermal conductor to a multi-chip structure, said thermal conductor including a plurality of movable pistons opposing each of a plurality of chips of said multi-chip structure, said method comprising steps of:

applying a thermal paste between each of said chips and said pistons;

adjusting a position of said pistons such that said thermal paste has a consistent thickness between each of said chips and said pistons;

forming a metallurgical bond between said pistons and said thermal conductor such that said pistons are permanently fixed in a position to maintain said consistent thickness; and bonding said thermal conductor to said multi-chip structure.

12. The method as in claim 11, wherein said step of forming a metallurgical bond comprise steps of:

metalizing a lower surface of said thermal conductor and said pistons;

applying a solder to said lower surface of said thermal conductor;

assembling said thermal conductor and said multi-chip structure; and reflowing said solder such that said solder forms said metallurgical bond.

13. The method as in claim 12, wherein said metalizing step comprises a step of metalizing said lower surface of said thermal conductor and said pistons with solder wettable metallurgy.

14. The method as in claim 12, wherein said step of applying said solder comprises a step of applying solder performs.

15. The method as in claim 11, wherein said step of adjusting a position of said pistons comprises a step of inserting springs between said thermal conductor and said pistons.

16. The method as in claim 11, wherein said step of adjusting a position of said pistons comprises a step of applying a force between said pistons and said chips to narrow said consistent thickness of said thermal paste to less than 5 mils.

17. The method as in claim 11, wherein said step of adjusting a position of said pistons comprises a step of applying a force between said pistons and said chips to narrow said consistent thickness of said thermal paste to about 3 mils.

18. The method as in claim 11, wherein said step of adjusting a position of said pistons comprises a step of applying a force between said pistons and said chips to narrow said consistent thickness of said thermal paste to less than 3 mils.

19. The method as in claim 11, wherein each of said chips has a different height and said step of adjusting said position of said pistons accommodates for said different height.

20. A method for thermally connecting a thermal conductor to a multi-chip structure having a substrate and a plurality of chips mounted on said substrate, said thermal conductor including a lower surface and a plurality of pistons extending from said lower surface, each of said chips having an upper surface opposing a corresponding one of said pistons, said method comprising steps of:

metalizing said lower surface of said thermal conductor and said pistons with solder wettable metallurgy;

applying a plurality of solder performs to said lower surface areas of said thermal conductor adjacent each of said pistons;

applying a thermal paste to said upper surface of said chips;

positioning said substrate and said thermal conductor such that said substrate is aligned with said thermal conductor;

clamping said thermal conductor against said substrate;

biasing said pistons toward said chips with springs, such that said thermal paste has a consistent thickness between each of said chips and pistons;

and reflowing said solder preforms, such that said solder bonds said substrate to said thermal conductor, reacts with said solder wettable metalization to form a metallurgical bond between said pistons and said thermal conductor, and fills all gaps between said pistons and said thermal conductor.

wherein after said reflowing step, said pistons and said thermal conductor form a unitary structure from maintaining said consistent thickness of said thermal paste between each of said chips and said pistons.

* * * * *